United States Patent [19]
Isobe et al.

[11] Patent Number: 6,004,392
[45] Date of Patent: Dec. 21, 1999

[54] FERROELECTRIC CAPACITOR AND MANUFACTURING THE SAME USING BISMUTH LAYERED OXIDES

[75] Inventors: Chiharu Isobe, Tokyo; Masataka Sugiyama, Kanagawa; Katsuyuki Hironaka, Kanagawa; Takaaki Ami, Kanagawa, all of Japan

[73] Assignee: Sony Corporation, Tokyo, Japan

[21] Appl. No.: 08/709,391

[22] Filed: Sep. 6, 1996

[30] Foreign Application Priority Data

Sep. 11, 1995  [JP]  Japan .................................. 7-258198

[51] Int. Cl.⁶ .................................................. C30B 25/02
[52] U.S. Cl. .............................. 117/88; 117/104; 117/945
[58] Field of Search ............................. 117/88, 104, 945

[56] References Cited

U.S. PATENT DOCUMENTS 4,702,791  10/1987  Mimura et al. ........................... 117/88
5,019,366   5/1991  Sakai ..................................... 423/592

FOREIGN PATENT DOCUMENTS 3-291247  12/1991  Japan .

*Primary Examiner*—Robert Kunemund
*Attorney, Agent, or Firm*—Hill & Simpson

[57] ABSTRACT

Described are a stable semiconductor memory device which is not susceptible to the influence of a heat treatment temperature of a semiconductor substrate of reaction pressure in the CVD method and is free from the reduction in remanence caused by data writing in repetition; and a fabrication process of such a device which comprises forming, by the CVD method, a ferroelectric film containing as a component element bismuth, suing a bismuth alkoxide compound as a raw material, and using the ferroelectric film as a film for the formation of storage capacitance for a semiconductor memory device.

9 Claims, 10 Drawing Sheets

F I G. 2
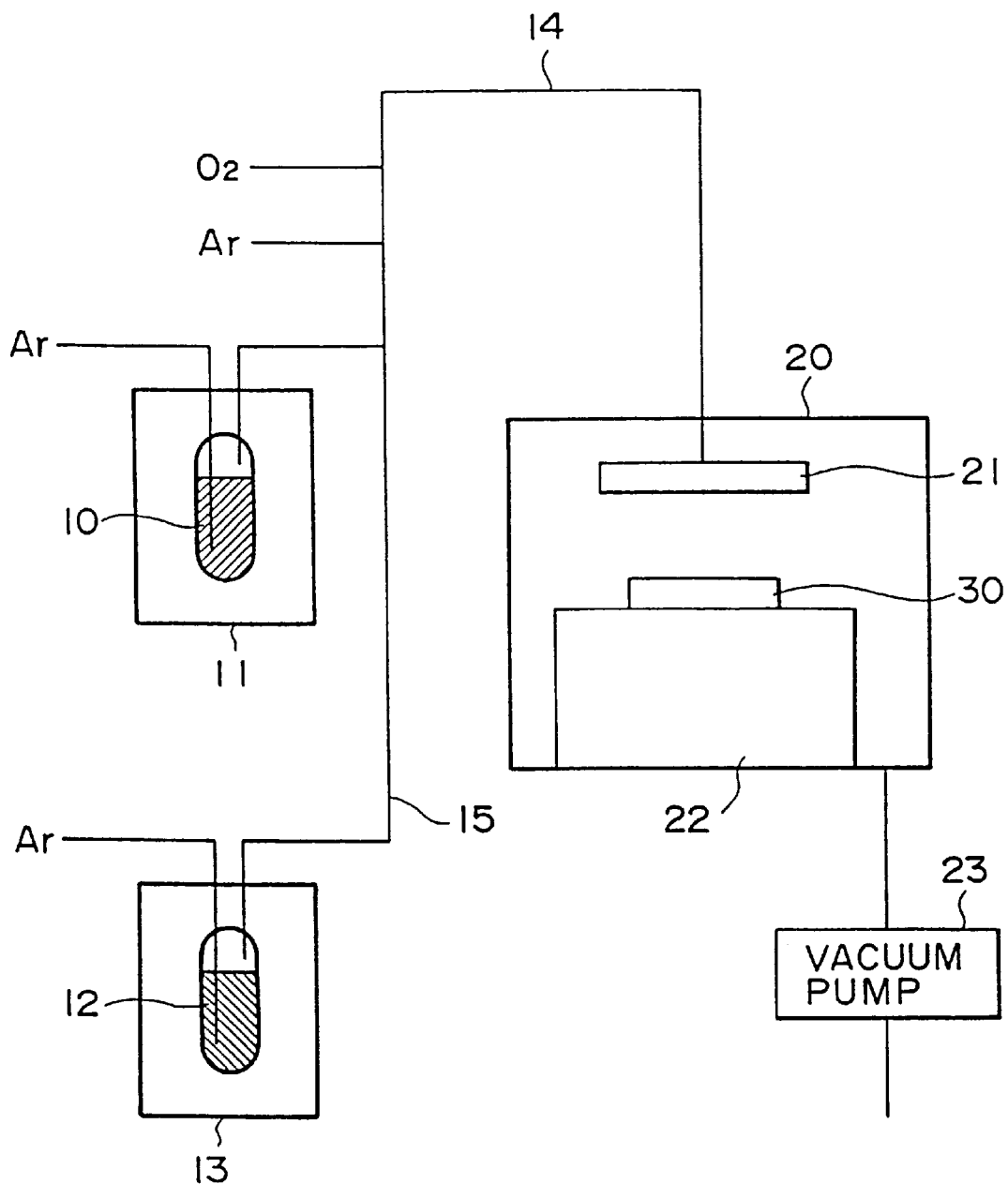

FERROELECTRIC CAPACITOR AND MANUFACTURING THE SAME USING BISMUTH LAYERED OXIDES

BACKGROUND OF THE INVENTION

1. Field of the Invention

This invention relates to a process for the preparation of bismuth oxide, a method for the formation of a bismuth layered oxide, and a method for the fabrication of a capacitor structure of a semiconductor device.

2. Description of the Related Art

In recent days, application researches of a non volatile memory cell which adopts a ferroelectric thin film have been briskly conducted accompanied with an advance in the film forming technique. This non volatile memory cell is a non volatile memory cell which makes use of a high-speed polarization inversion of a ferroelectric thin film and its remanence and is high-speed reloadable. The non volatile memory cell adopting a ferroelectric thin film, which cell is under study now, can be classified into two systems, that is, a system of detecting a change in the accumulated charge amount of a ferroelectric capacitor and a system of detecting a change in resistance caused by the spontaneous polarization of the ferroelectric substance. The semiconductor device according to the present invention belongs to the former one.

At high temperatures, triphenyl bismuth vaporizes accompanied with decomposition so that the temperature control for maintaining a stable vapor amount is very difficult. For example, according to Literature 1, that is, "Ferroelectric bismuth titanate films by hot wall metalorganic chemical vapor deposition" in J. Si, et al., "J. Appl. Phys. 73(11), 7910–7913(Jun. 1, 1993)", it is necessary to maintain a container for raw materials at a temperature of from 165 to 170 in order to secure a sufficient vapor pressure of triphenyl bismuth. When the container for raw materials is maintained at such a high temperature, the following disadvantages occur.

(A) Triphenyl bismuth in the container for raw materials is gradually decomposed when exposed to high temperatures for a long time, so that it becomes difficult to continue a stable gas supply.

(B) It is necessary to heat each part of the MOCVD apparatus such as a container for raw materials and piping to 150–200° C. in order to conduct efficient gas supply and besides, to prevent recoagulation in the piping during transportation to the MOCVD reaction chamber. It is however difficult to conduct temperature control or temperature management for the above purpose.

Triphenyl bismuth is a relatively stable substance. Its reactivity is, on the other hand, low so that the concentration of its component cannot easily be increased at the time of forming a ferroelectric thin film by the MOCVD method. In addition, triphenyl bismuth and its analogous compounds are not advantageous for the formation of its oxide film because they do not have a metal-oxygen bond in their molecules. When a ferroelectric thin film, which is an oxide film, is formed on the surface of a base material, both of the decomposition reaction of triphenyl bismuth and the reaction with oxygen are necessary as the reaction steps on the surface of the base material. Accordingly, the use of the above-described source raw materials requires the external addition of an oxidation source. The preparation of bismuth oxide using triphenyl bismuth is conducted as follows:

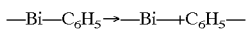

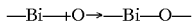

Described specifically, when bismuth oxide is prepared using triphenyl bismuth, the reaction is conducted through two steps. So, the preparation of bismuth oxide or formation of an oxide film containing bismuth as a component element is susceptible to the temperature of the base material or the reaction pressure in the MOCVD reaction chamber.

SUMMARY OF THE INVENTION

An object of the present invention is therefore to provide a process for the preparation of bismuth oxide, a method for the formation of bismuth layered oxides and a method for the fabrication of a capacitor structure of a semiconductor device, each of which employs a material having a sufficient vapor pressure at low temperatures, having a high decomposition temperature, not easily decomposed during the process of vaporization and transportation, capable of maintaining a stable vapor pressure over a long period of time, having a deposition rate controlled by the raw material supplying rate at a sedimentation temperature and not causing a uniform nucleus formation reaction in the vapor phase; and is not easily influenced strongly by the temperature of the base material or the reaction pressure in the CVD method.

The process for the preparation of bismuth oxide of the present invention for attaining the above object comprises forming bismuth oxide by the CVD method by using a bismuth alkoxide compound as a raw material.

In addition, the process for the formation of a bismuth layered oxide of the present invention for attaining the above object comprises forming an oxide film, which contains bismuth as a component element, by the CVD method by using a bismuth alkoxide compound as a raw material. The bismuth alkoxide compound is represented by the following structural formula:

formula 2

Incidentally, it is preferred that as an alkyl group (R) bonded to oxygen, that having comparatively many carbon atoms, for example, having 3–6 carbon atoms is used to prevent polymerization between molecules and to improve the volatility. Examples of the alkyl group include $C(CH_3)_3$, $CH_2C(CH_3)_3$, $CH(CH_3)_2$, $(CH_2)_2C(CH_3)$ and the like.

Furthermore, the process for the fabrication of a capacitor of a semiconductor device according the present invention for attaining the above object comprises:

(i) forming a lower electrode layer on a base material, (ii) forming a ferroelectric thin film, which contains bismuth as a component element on said lower electrode layer, by the CVD method, by using a bismuth alkoxide compound as a raw material, and (iii) forming an upper electrode layer on said ferroelectric thin film.

In the process for the formation of a ferroelectric thin film or the process for the fabrication of a capacitor structure of a semiconductor device according to the present invention, the oxide film or ferroelectric thin film can be formed from a ferroelectric material having a Bi-type layered perovskite structure. Specific examples of the ferroelectric material for the ferroelectric thin film include $Bi_2SrTa_2O_9$, $Bi_2SrNb_2O_9$, $Bi_2BaTa_2O_9$, $Bi_4SrTi_4O_{15}$, $Bi_4Ti_3O_{12}$, $Bi_2SrTa_xNb_{2-x}O_9$ and $Bi_2PbTa_2O_9$. Of these, the ferroelectric thin film formed from a Y1 base material [$Bi_2(Sr, Ba, Ca)(Ta, Nb)_2O_9$] is preferred, with $Bi_2SrTa_2O_9$ being more preferred.

In the present invention, a bismuth alkoxide compound [$Bi(OR)_3$ in which R represents an alkyl group] containing oxygen in its molecule is used as a source raw material for the CVD so that its oxide, oxide film or ferroelectric thin film (which may hereinafter be collectively called "oxide or the like") can be prepared or formed easily. This is because an oxygen atom in the bismuth alkoxide compound is easily introduced in the network of the oxide and it is possible to prepare or form the oxide or the like without externally adding an oxidization source.

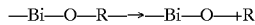

Accordingly, the preparation or formation of the oxide or the like from an organic metal compound can be completed by the reaction in one step. When the oxide or the like is prepared or formed, a bismuth alkoxide compound containing in its molecule an oxygen atom is obviously superior to triphenyl bismuth as the source raw material for the CVD. By employing such a bismuth alkoxide compound, it is possible to widen the allowable range of the CVD conditions (temperature, pressure and the like) in order to obtain an oxide film or ferroelectric thin film having a desired composition. Furthermore, based on its high reactivity, it is possible to prepare or form an oxide or the like at lower temperatures.

BRIEF DESCRIPTION OF THE DRAWINGS

FIG. 2 shows a MOCVD apparatus used to produce the bismuth oxide layers.

DETAILED DESCRIPTION OF THE PREFERRED EMBODIMENTS

Figure 1:
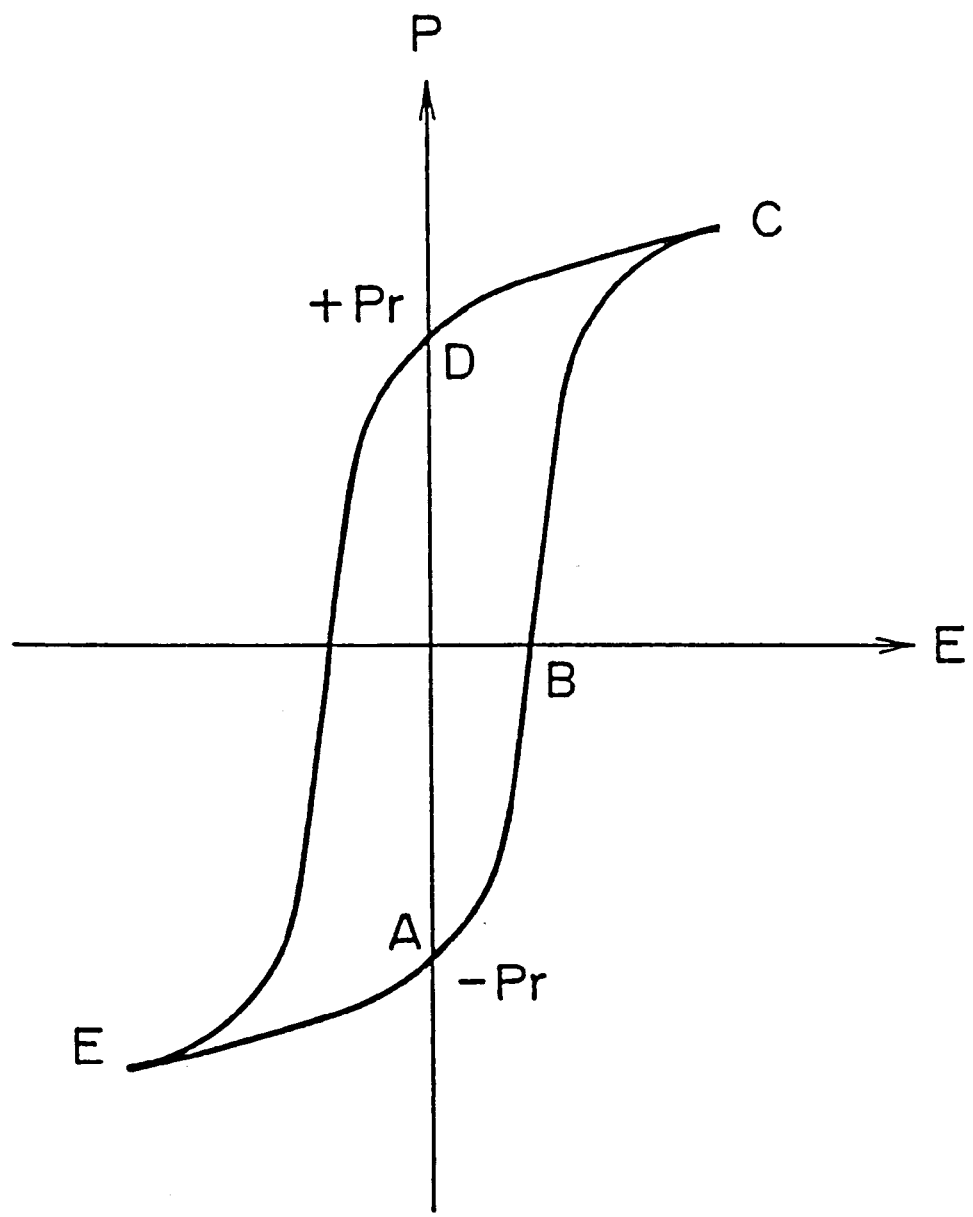
FIG. 1 shows a P-E hysteresis loop of a ferroelectric substance of the invention.

As an example of the nonvolatile memory cell which adopts a system of detecting a change in the accumulated charge amount of a ferroelectric capacitor, a nonvolatile memory cell having a structure of one capacitor+one transistor, that is, a structure in which a selective transistor has been added to a ferroelectric capacitor can be given. The ferroelectric capacitor is formed of, for example, a lower electrode, an upper electrode and a ferroelectric thin film interposed therebetween. To writing or reading of data in the nonvolatile memory cell of such a type, a P-E hysteresis loop of the ferroelectric substance shown in FIG. 1 is applied. When an external electric field is added to the ferroelectric thin film and then the external electric field is removed, the ferroelectric thin film shows spontaneous polarization. The remanence of the ferroelectric thin film becomes $+P_r$ when the external electric field in the plus direction is applied, while it becomes $-P_r$ when the external electric field in the minus direction is applied. Here, the remanence under the condition of $+P_r$ (refer to "D" of FIG. 1) is designated as "0", while the remanence under the condition of $-P_r$ (refer to "A" of FIG. 1) is designated "1".

With a view to discriminating whether the condition is "1" or "0", an external electric field, for example, in the plus direction is applied to the ferroelectric thin film, by which the polarization of the ferroelectric thin film shows the condition of "C" in FIG. 1. If the data is "0" at this time, the polarization condition of the ferroelectric thin film changes from "D" to "C". If the data is "1", on the other hand, the polarization condition of the ferroelectric thin film changes from "A" to "C" through "B". When the data is "0", no inversion of polarization occurs in the ferroelectric thin film. When the data is "1", on the other hand, inversion of polarization occurs in the ferroelectric thin film. As a result, there appears a difference in the accumulated charge amount of the ferroelectric capacitor. This storage charge is detected as a signal current by turning the selective transistor of the selected memory cell on. When the external electric field is set at 0 subsequent to the reading of the data, the polarization condition of the ferroelectric thin film inevitably becomes "DD" in FIG. 1 irrespective that the data is "0" or "1". Accordingly, when the data is "1", the polarization condition is changed to "A" through "D" and "E" by applying the external electric field in the minus direction and writing of data "1" is performed.

The ferroelectric thin film composed of a ferroelectric material having a Bi-type layered perovskite structure (may hereinafter be called "bismuth layer-structured ferroelectric thin film") cannot be found to have a fatigue phenomenon (lowering in remanence owing to reloading of data in repetition) which has been the greatest defect of the conventional PZT type ferroelectric thin film. It has therefore attracted attentions as a ferroelectric thin film for the above-described non volatile memory. Upon application of the bismuth layer-structured ferroelectric thin film to such non volatile memory, the development of the technique for the formation of such a thin film is indispensable. Under the present conditions, it is said that the ferroelectric thin film showing good ferroelectric characteristics can be obtained based on the spin coating method such as the MOD (Metal Organic Decomposition) method. For the application of the thin film to a memory of high integration, however, there is a strong demand for the development of the MOCVD method which is excellent in step coverage property, film quality, uniformity, suppression of particle formation and deposition rate.

The source raw material for the MOCVD method is required to have the following properties:

(1) having a sufficient vapor pressure at low temperatures,
(2) having a high decomposition temperature and not causing decomposition during vaporization and transportation steps,
(3) capable of maintaining a stable vapor pressure for a long period of time, and
(4) having a deposition rate controlled by the raw material supplying rate at a sedimentation temperature and being free from a uniform nucleus formation reaction in the vapor phase. In addition, it is desired that the raw material is supplied in the form of a liquid or gas rather than a solid for the supply of a raw material gas always in the state of saturated vapor pressure. Furthermore, it is also required as a condition that no reaction occurs between the source raw materials in the vapor phase. Almost no commercially-available source raw materials for the MOCVD which are used for the formation of a ferroelectric thin film having a bismuth layered structure, however, can satisfy the above-described conditions. At present, some devices are given to the MOCVD apparatus to cope with the present situation.

As the source raw material for MOCVD for bismuth which is a main component element of the bismuth layer-structured ferroelectric thin film, only triphenyl bismuth and its analogous compound as shown below are put on the market at present.

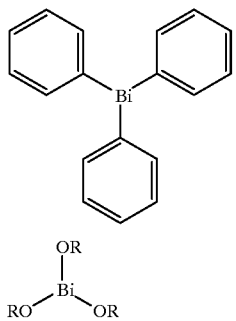

Embodiment 1

Embodiment 1 relates to a process for the formation of a bismuth layered oxide by the CVD method (more specifically, the conventional MOCVD method) using tributoxy bismuth [$Bi(OC(CH_3)_3)_3$]. As shown in the schematic diagram of FIG. 2, the MOCVD apparatus is formed of raw material containers 10,12 each made of stainless steel, an MOCVD reaction chamber 20, and pipings 14,15 which connect the raw material containers 10,12 with the MOCVD reaction chamber 20. The raw material containers 10,12 are accommodated in constant-temperature baths 11,13 so that the source raw materials in the raw material containers 10,12 can be maintained at a desired temperature. For the pipings 14,15, a heating means such as a heater (not illustrated) is disposed and it is capable of maintaining the raw material gas, which flows in the pipings, at a desired temperature. The raw material gas introduced in the MOCVD reaction chamber 20 is blown to the base material 30 mounted on a base material stage 22 through a gas blowing nozzle 21, whereby a thin film is formed over the surface of the base material 30. Incidentally, a heater (not illustrated) is integrated in the base material stage 22, which makes it possible to heat the base material 30 to a desired temperature. Gas in the MOCVD reaction chamber 20 is exhausted by a vacuum pump 23.

Upon performing the MOCVD method, tributoxy bismuth filled in the raw material container 10 made of stainless steel is heated to 80–110° C. Into thus-heated raw material container 10, an argon gas is introduced at a flow rate of 50–100 cc, followed by sublimation of tributoxy bismuth under heating at reduced pressure. At this time, heating at the temperature exceeding 110° C. causes even decomposition of a trace amount of tributoxy bismuth together with sublimation so that a care should be exercised to avoid heating of tributoxy bismuth at temperatures higher than 110° C. Into the piping 14 maintained at about 110° C., tributoxy bismuth so sublimated is introduced and then sent to the MOCVD reaction chamber 20. Incidentally, when triphenyl bismuth, which is a conventionally-used raw material, is employed, it is necessary to maintain the raw material container and pipings at 165–170° C. and 180–200° C., respectively.

On the base material 30 mounted on the base material stage 22 and maintained at 300–800° C., preferably 400–650° C., a tributoxy-bismuth-containing gas is introduced together with an oxygen gas and an argon gas for dilution, whereby bismuth oxide is grown on the base material 30. Bismuth oxide can be grown on a silicon semiconductor substrate, $SiO_2$ and a base material 30 formed from platinum (Pt) or the like. When triphenyl bismuth, a conventionally-employed material, is used, on the other hand, bismuth oxide can be grown on the base material formed from platinum but cannot be grown on a silicon semiconductor substrate or $SiO_2$. In this point, it is of a great advantage to use tributoxy bismuth as a source raw material. Incidentally, a comparison in the physical properties between tributoxy bismuth and triphenyl bismuth is shown in the following Table 1.

TABLE 1

|  | Tributoxy bismuth | Triphenyl bismuth |
|---|---|---|
| Melting point | 110° C. | 78° C. |
| Vaporization temperature | 80–110° C. | 150–160° C. |
| Vaporizing method | Sublimation | Evaporation (bubbling) |
| Vapor pressure | 13 Pa (100° C.) | 13 Pa (80° C.) |

Embodiment 2

Embodiment 2 relates to the method of the present invention for the formation of a bismuth layered oxide. More specifically, a description will next be made of a method for the formation of a bismuth layered oxide, which is a ferroelectric thin film comprising a Y1 base material ($Bi_2SrTa_2O_9$), in accordance with the conventional MOCVD method, using tributoxy bismuth.

As in Embodiment 1, tributoxy bismuth filled in the raw material container 10 made of stainless steel is heated to 80–110° C. Into this raw material container 10, an argon gas is introduced at a flow rate of 50–100 cc and tributoxy bismuth is sublimated under heating at reduced pressure. Tributoxy bismuth so sublimated is then introduced into the piping 14 maintained at about 110 and sent to the MOCVD reaction chamber 20. Tantalum pentaethoxide [$Ta(OC_2H_5)_5$)] filled in another raw material container 12 is heated to 120° C., followed by bubbling with an argon gas at a flow rate of 50–100 cc. The tantalum pentaethoxide so vaporized is introduced into the piping 15 made of stainless steel, which piping has been heated to 130° C., and then sent to the MOCVD reaction chamber 20. Strontium-tetramethyheptendine ($Sr(thd)_2$) filled in a still further container (not illustrated) is heated to 150° C., followed by bubbling with an argon gas at a flow rate of 50–100 cc. The strontium DPM tetraethylenepentammine so vaporized was introduced into a piping (not illustrated) made of stainless steel heated to 160° C., followed by transportation to the MOCVD reaction chamber 20. On the base material 30 formed from platinum (Pt), which base material having been maintained at 300–800, preferably 400–700, the above-described three source raw materials, that is, tributoxy bismuth, tantalum pentaethoxide and $Sr(thd)_2$ were introduced at the same time together with an oxygen gas and an argon gas for dilution, whereby an oxide film comprising Bi, Sr and Ta is formed on the surface of the base material 30. In order to obtain a desired composition (Bi:Sr:Ta=2:1:2), the flow rate of the argon gas to be introduced into the raw material container, the heating temperature of the raw material container or the like may be adjusted, thereby controlling the feeding amount of each source raw material to the MOCVD reaction chamber 20. In this way, it is possible to form an oxide film which is a ferroelectric thin film formed of $Bi_2SrTa_2O_9$.

Figure 3A:
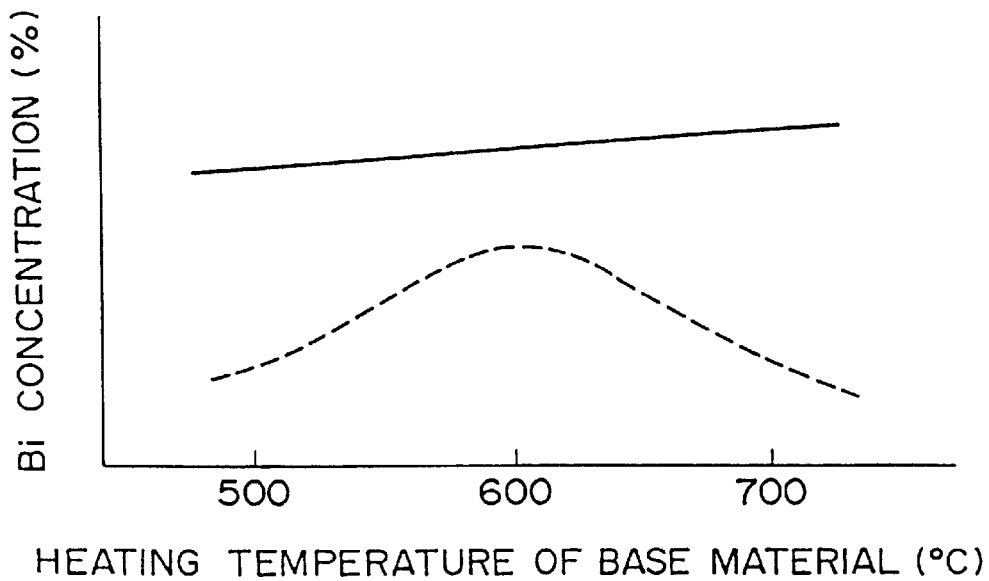
FIGS. 3($a$) and 3($b$) each illustrates the characteristics of the oxide films of one embodiment of the invention.
Figure 3B:
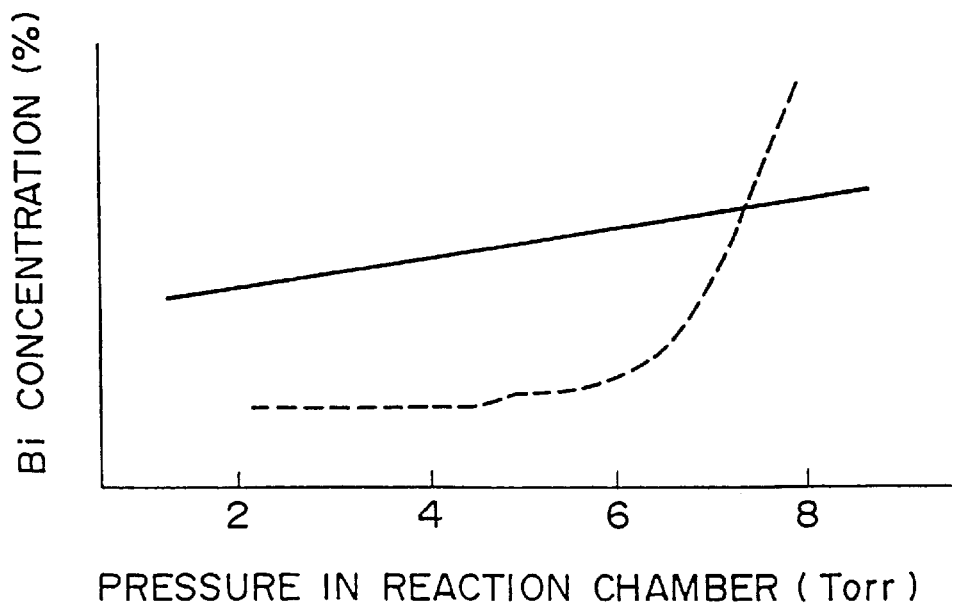

FIGS. 3A and 3B each illustrates the characteristics of the oxide films made respectively from Y1 base materials ($Bi_2SrTa_2O_9$) by using tributoxy bismuth and triphenyl bismuth. Described specifically, FIG. 3A illustrates dependence of the Bi concentration on the base material temperature when the Sr concentration in the oxide film is designated as 1. FIG. 3B illustrates the dependence of the Bi concentration on the pressure in the MOCVD reaction chamber when the Sr concentration in the oxide film is designated as 1. Incidentally, the solid line indicates the case of tributoxy bismuth, while the dotted line the case of triphenyl bismuth.

From FIGS. 3A and 3B, it has been found that in the case that triphenyl bismuth is used, the Bi concentration is largely influenced by the temperature of the base material and the pressure in the MOCVD reaction chamber. In the case where tributoxy bismuth is used, on the other hand, the influences of the temperature of the base material and the pressure in the MOCVD reaction chamber are small. Accordingly, in the case where an oxide film containing a desired Bi as a component element is formed, the use of tributoxy bismuth, compared with the use of triphenyl bismuth, makes it possible to widen the allowable range of a fluctuation in the temperature of the base material, reaction pressure or the like, thereby controlling the composition of the oxide film more easily. It is therefore possible to form an oxide film with good reproducibility when tributoxy bismuth is used as a source raw material.

Embodiment 3

Embodiment 3 illustrates the preparation of a capacitor of a ferroelectric thin film composed of the bismuth-layered compound having the formula $Bi_2SrTa_2O_9$ by flash CVD method where source materials are transferred and mixed in a liquid phase and then evaporated under rapidly reduced pressure in a reactor.

In the flash CVD method, source materials, for example, tributoxy bismuth, $Sr(thd)_2$, $Ta(O—iC_3H_7)_4(thd)$, are independently dissolved in organic solvent such as tetrahydrofuran (THF) etc. to prepare about 0.1 M/L of each solution. Each solution is filled in a stainless steel container.

These solutions are mixed at a mixing manifold so as to attain the initial ratio of Bi/Sr/Ta (2/1/2) by atomic composition, then transferred in liquid form and introduced to a vaporization unit. The vaporization unit has previously been heated such that the source materials are not deposited to be adhered onto its inside wall.

The vapor from the solution is introduced with an Ar carrier gas into a reactor.

The vaporization unit and the reactor have previously been reduced 10 torr or thereabout to evaporate the source solution. The vapor from the source solution is transferred in a gas phase to, and deposited on, the substrate.

For deposition, the substrate has previously been heated at 400–800° C. or thereabout.

Separately, an oxidizing gas such as pure oxygen etc. is introduced directly into the reactor without passing it through the vaporization unit.

The Ar carrier gas and the oxidizing gas are fed to the reactor respectively under the control of a mass flow controllers, preferably adjusting the total flow of 500–1800 sccm and the partial pressure of oxygen to about 20 to 50%. In this manner, an oxide thin film containing Bi, Sr and Ta elements those crystal phase is amorphous or fluorite structure can be obtained.

Subsequently, this thin film of the compound with amorphous or fluorite structure is thermally treated at 800° C. for 1 hour in a stream of oxygen under normal pressure.

As a result, the thin film containing the desired formula $Bi_2SrTa_2O_9$ whose crystal phase is bismuth layered structure can be obtained.

Embodiment 4

Embodiment 4 relates to a method for the fabrication of a capacitor structure of a semiconductor device according to the present invention, said method including a process for the formation of a ferroelectric thin film, which contains as a component element bismuth, by the CVD method by using a bismuth alkoxide compound as a raw material. The ferroelectric thin film is composed of $Bi_2SrTa_2O_9$ which is a Y1 base material and the semiconductor device is formed of the above-described non volatile memory cell (so-called FERAM).

Figure 4:
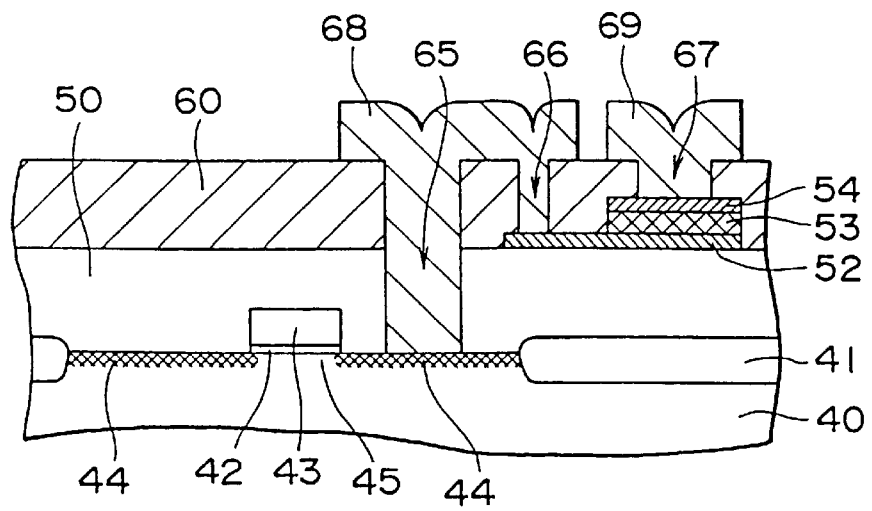
FIG. 4 shows a cross section of a semiconductor device produced by the invention
Figure 5:
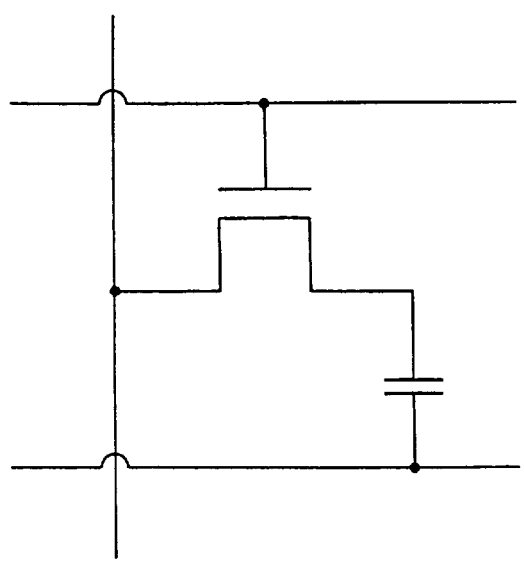
FIG. 5 shows an equivalent circuit of the semiconductor device.

FIG. 4 is a fragmentary schematic cross-sectional view illustrating a semiconductor device fabricated based on the fabrication method of the capacitor structure of the semiconductor device according to Embodiment 4. FIG. 5 illustrates an equivalent circuit of the semiconductor device. This semiconductor device has a capacitor structure in which a lower electrode layer 52, a ferroelectric thin film 53 formed of a bismuth layer-structured ferroelectric thin film and an upper electrode layer 54 have been stacked one over another. The ferroelectric thin film 53 is formed of an oxide film which is composed of $Bi_2SrTa_2O_9$ and contains bismuth as a component element.

Described specifically, this semiconductor device is formed of source and drain regions 44 and a channel region 45, both formed on a silicon semiconductor substrate 40, a gate electrode 43 formed above the channel region 45, an element isolation region 41 having an LOCOS structure, and a gate oxide film 42 formed beneath the gate electrode 43. These source and drain regions 44, channel region 45 and gate electrode 43 constitute the so-called selective transistor. Incidentally, the gate electrode 43 serves also as a word line and it is composed of, for example, polysilicon, polycide or metal silicide. The source and drain regions 44 and the gate electrode 43 are covered with an insulation layer 50. The insulation layer 50 is, for example, composed of BPSG.

In the capacitor structure of this semiconductor device, the lower electrode layer 52 made of Pt (platinum) is formed on the insulation layer 50 composed of PBSG. On the lower electrode layer 52, the ferroelectric thin film 53, which is a bismuth layer-structured ferroelectric thin film and is composed of $Bi_2SrTa_2O_9$, is formed. And, on the ferroelectric thin film 53, the upper electrode layer 54 made of Pt is formed.

On the insulation layer 50, the lower electrode layer 52 and the upper electrode layer 54, an upper insulation layer 60 comprising, for example, BPSG is formed. In the insulation layer 50 and the upper insulation layer 60 above one of the source and drain regions 44 (for example, a source region), a contact plug 65 is formed. This contact plug 65 is electrically connected on its bottom with the one of the source and drain regions. Also in the upper insulation layer 60 above the lower electrode layer 52, a contact plug 66 is formed. The lower electrode layer 52 is electrically connected with the one of the source and drain regions 44 through the contact plug 66, a first interconnection layer 68 and the contact plug 65. The upper electrode layer 54 is electrically connected with a second interconnection layer 69 through a contact plug 67 formed above the upper electrode layer 54. The second interconnection layer 69 corresponds to a plate line.

The other one of the source and drain regions 44 (for example, a drain region) is electrically connected with a bit line (not illustrated) through a bit contact portion (not illustrated).

A description will next be made of a method for the fabrication of the semiconductor device in Embodiment 4 with reference to FIGS. 6A–6F, which are fragmentary schematic cross-sectional views of the semiconductor substrate and the like.

[Step-300]

First, on a silicon semiconductor substrate 40, an element isolation region 41 having a LOCOS structure is formed in a manner known to date. The surface of the semiconductor substrate 40 is then oxidized to form a gate oxide film 42. After a polysilicon layer is deposited all over the surface, for example, by the CVD method, the polysilicon layer is patterned by the photolithography and etching techniques, whereby a gate electrode 43 made of polysilicon is formed. Incidentally, this gate electrode 43 serves also as a word line. Ion implantation of impurities and activation treatment of the impurities so implanted are then conducted, whereby source and drain regions 44 and a channel region 45 are formed.

[Step-310]

On the semiconductor substrate 40, an insulation layer 50 (corresponding to a base material) composed of, for example, BPSG is then formed by the CVD method. In this way, the structure shown in FIG. 6A can be obtained. Incidentally, after formation of the insulation layer 50 made of BPSG, it is preferred to reflow the insulation layer 50 in a nitrogen gas atmosphere, for example, at 900° C. for 20 minutes. Furthermore, it is desired to flatten the insulation layer 50 by chemically and mechanically polishing the top surface of the insulation layer 50 by, for example, the chemical and mechanical polishing method (CMP method) or by the etchback method at need. The following is one example of the film forming conditions of the insulation layer 50:

Gas used: $SiH_4/PH_3/B_2H_5$

Film-forming temperature: 400° C.

Reaction pressure: normal pressure

A lower electrode layer 52 is then formed on the insulation layer 50 corresponding to the base material. Described specifically, on the insulation layer 50, the lower electrode layer 52 formed of Pt is deposited by the RF magnetron sputtering method. The lower electrode layer 52 is adjusted to a thickness of 0.1–0.2 $\mu$m (refer to FIG. 6B). The lower electrode layer 52 is thereafter patterned to a desired form by employing, for example, the ion milling technique. The following is one example of the RF magnetron sputtering conditions:

Anode voltage: 2.6 kV

Input potential: 1.1–1.6 W/cm$^2$

Processing gas: $Ar:O_2=90:10$

Pressure: 0.7 Pa

Film-forming temperature: 600–750° C.

Deposition rate: 5–10 mm/min

[Step-330]

On the lower electrode layer 52, a ferroelectric thin film 53 containing bismuth as a component element is then formed by the CVD method, using a bismuth alkoxide compound as a raw material. Described specifically, the ferroelectric thin film 53, which is a bismuth layer-structured ferroelectric thin film and is composed of Bi2SrTa2O9, is formed on the lower electrode layer 52 by the MOCVD method using tributoxy bismuth as a raw material gas under the similar conditions to the method for the formation of the ferroelectric thin film described in Embodiment 2 (refer to FIG. 6C). Incidentally, it is also possible to form the ferroelectric thin film 53 comprising bismuth titanate in a similar manner to [Step-420] in Embodiment 4 which will be described later.

[Step-340]

On the ferroelectric thin film 53 so formed, an upper electrode layer 54 is then formed. The upper electrode layer 54 is composed of Pt and can be formed in a similar manner to [Step-320].

[Step-350]

Figure 6A:
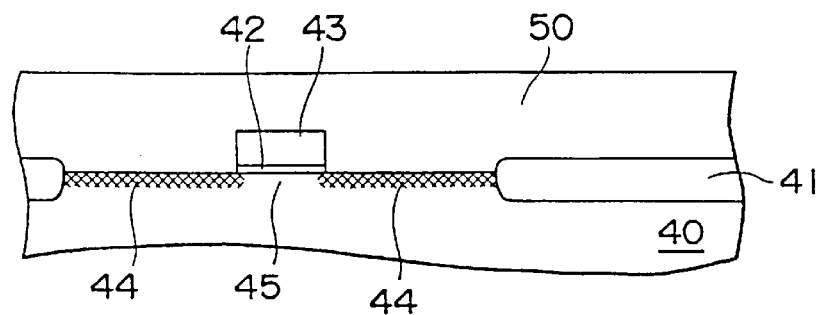
FIGS. 6 ($a$) to 6($f$) show the fabrication method for a semiconductor device.
Figure 6B:
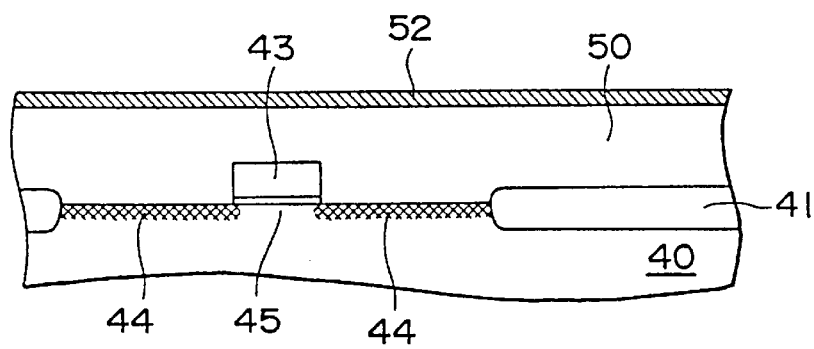
Figure 6C:
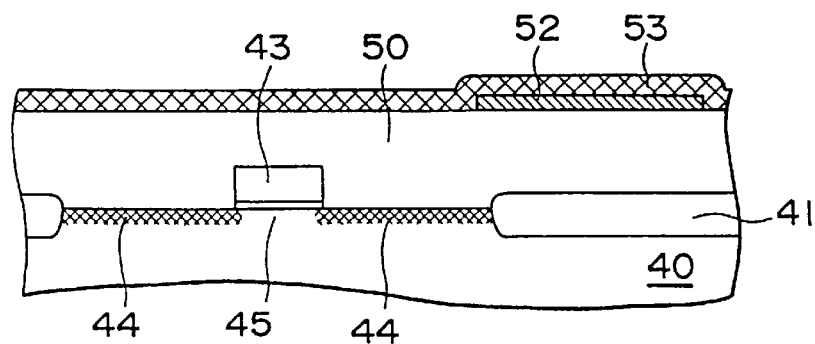
Figure 6D:
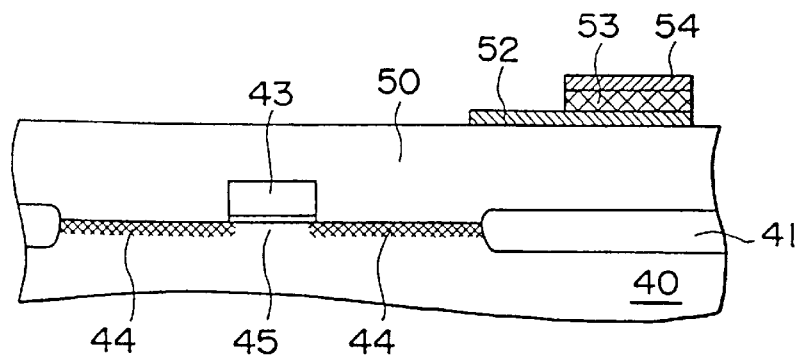
Figure 6E:
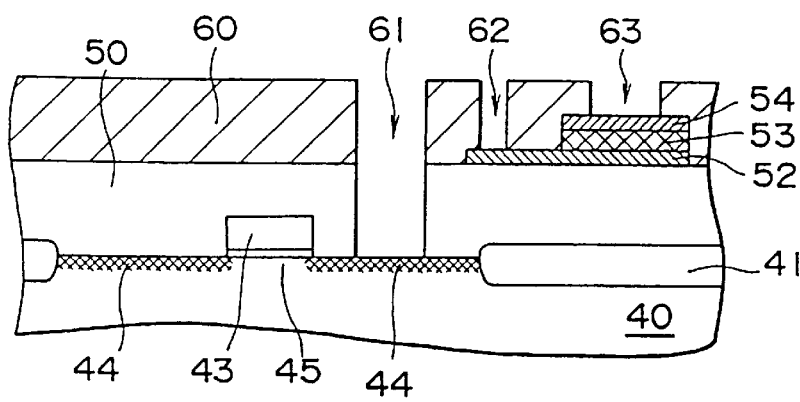

The upper electrode layer 54 composed of Pt is thereafter patterned into a desired shape by employing, for example, the ion milling technique, followed by further patterning of the ferroelectric thin film 53 by the RIE method. In this way, the capacitor structure as shown in FIG. 6D can be fabricated.

[Step-360]

On the insulation layer 50, the lower electrode layer 52 and the upper electrode layer 54, an upper insulation layer 60 composed of BPSG is then formed. Incidentally, it is desired to subject the upper insulation layer 60 to a flattening treatment subsequent to the formation of the upper insulation layer 60. In the insulation layer 50 and the upper insulation layer 60 above one of the source and drain regions, an opening 61 is formed by employing the photolithography and etching techniques. In addition, in the upper insulation layer 60 above the lower electrode layer 52 and above the upper electrode layer 54, openings 62,63 are formed, respectively (refer to FIG. 6E).

[Step-370]

Figure 6F:
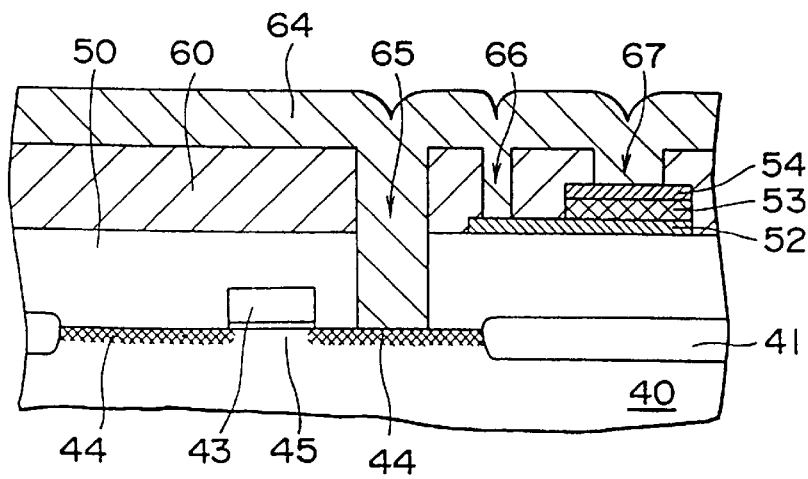

On the upper insulation layer 60 including openings 61,62,63, Ti and TiN layers are formed by the sputtering method, followed by the formation of an interconnection material layer 64 composed of an aluminum alloy (for example, Al–1% Si) on the TiN layer by the so-called high-temperature aluminum sputtering method (refer to FIG. 6F). Film-forming conditions of the Ti layer, TiN layer and the interconnection material layer composed of an aluminum alloy will be exemplified below. Incidentally, the Ti and TiN layers are formed with a view to obtaining an ohmic and low contact resistance, preventing the semiconductor substrate 40 from being damaged by the interconnection material layer composed of an aluminum alloy and improving the wetting property of the aluminum alloy.

Ti layer (thickness: 20 nm)
    Processing gas: Ar=35 sccm
    Pressure: 0.52 Pa
    RF power: 2 kW
    Heating of the substrate: no heating TiN layer (thickness: 100 nm)
    Processing gas: N2:Ar=100:35 sccm
    Pressure: 1.0 Pa
    RF power: 6 kW
    Heating of the substrate: not heating Interconnection material layer made of an aluminum base alloy
    Processing gas: Ar=100 sccm
    Pressure: 0.26 Pa
    RF power: 15 kW
    Heating temperature of the substrate: 475° C.

In this manner, the aluminum alloy is buried in the openings 61,62,63, whereby contact plugs 65,66,67 are formed (refer to FIG. 6F). Incidentally, in FIG. 4 and FIG. 6F, the TiN layer and Ti layer are not illustrated. The interconnection layer 64, Tin layer and Ti layer on the upper insulation layer 60 are then patterned, whereby a first interconnection layer 68 and a second interconnection layer 69 are formed (refer to FIG. 4).

The film formation of the interconnection material layer composed of an aluminum base alloy is conducted by the so-called high-temperature aluminum sputtering method, but the film formation method is not limited to such a method. The film can also be formed by the so-called high-temperature reflow method or high-pressure reflow method. In the high-temperature reflow method, the interconnection material layer made of an aluminum base alloy is deposited on the upper insulation layer 60 under the conditions illustrated below:

Processing gas: Ar=100 sccm
DC power: 20 kW
Sputtering pressure: 0.4 Pa
Heating temperature of substrate: 150° C.

The semiconductor substrate 40 is then heated to about 500° C., by which the interconnection material layer composed of an aluminum alloy, which layer has been deposited on the upper insulation layer 60, changes to a fluid state. The interconnection material layer then flows into the openings 61,62,63 and the openings 61,62,63 are filled certainly with the aluminum base alloy, whereby the contact plugs 65,66, 67 are formed. On the upper insulation layer 60, on the other hand, the interconnection material layer made of the aluminum base alloy remains. Heating can be conducted under the conditions as exemplified below.

Heating system: Heating from the reverse side of the substrate with a gas
Heating temperature: 500° C.
Heating time: 2 minutes
Processing gas: Ar=100 sccm
Processing gas pressure: $1.1 \times 10^3$ Pa The term "heating from the reverse side of the substrate with a gas" as used herein means heating of the semiconductor substrate 40 by heating a heater block disposed on the reverse side of the semiconductor substrate 40 to a predetermined temperature (heating temperature) and introducing a processing gas between the heater block and the reverse side of the semiconductor substrate 40. Heating can also be conducted by using a lamp heating system.

Instead of the high-temperature reflow method, high-pressure reflow method can be employed. In this case, the reflow treatment is conducted by the conditions illustrated below:

Heating temperature of the substrate: 400° C.
Heating time: 2 minutes
Heating atmosphere: argon gas
Pressure of the atmosphere: at least $10^6$ Pa In Embodiment 4, instead of forming the lower electrode layer from Pt, the lower electrode layer can be formed singly of La—Sr—Co—O (LSCO) having a perovskite structure or formed of two layers of LSCO and Pt with the Pt layer being on the LSCO layer. The film-forming conditions for LSCO by the pulsed laser ablation method are exemplified below:

Target: LSCO
Laser used: KrF excimer laser (wave length: 248 nm, pulse width: 25 n/sec, 3Hz)
Output energy: 400 mJ (1.1 J/cm$^2$)
Film-forming temperature: 550–600° C.
Oxygen partial pressure: 40–120 Pa Embodiment 5

Embodiment 5 relates to a method for the formation of a bismuth layered oxide and a method for the fabrication of a capacitor structure of a semiconductor device according to the present invention.

In a nonvolatile memory cell which adopts a system of detecting a change in the accumulated charge amount of a ferroelectric capacitor, it is an extremely significant technical problem how to heighten the remanence Pr of the ferroelectric thin film and how to maintain the remanence Pr at a high value. It becomes possible to detect easily and securely which data the semiconductor memory cell maintains, "0" or "1", by increasing the remanence Pr of the ferroelectric thin film. For the above purpose, it is necessary to cause an epitaxial growth of the ferroelectric thin film on the lower electrode layer.

When the lower electrode layer 52 is formed of Pt(100), the lattice plane distance of Pt(100) matches with the lattice plane distance of $Bi_2SrTa_2O_9$, $Bi_4SrTi_4O_{15}$, $Bi_2SrTi_2O_9$ or the like. Accordingly, such a ferroelectric material can be epitaxially grown on the Pt(100) and the remanence Pr of the ferroelectric thin film so formed on the Pt(100) can be increased. The lower electrode layer cannot however be formed of Pt(100) on the insulation layer 50 which is composed of an amorphous material such as PBSG, which involves a problem that the remanence Pr of the ferroelectric thin film cannot be increased.

In the literature "Ferroelectric La—Sr—Co—O/Pb—Zr—Ti—O—/La—Sr—Co—O heterostructure on silicon via template growth" in R. Ramesh, et al., "Appl. Phys. Lett. 63(26), 3592–3594(Dec. 27, 1993)", (hereinafter called "Literature 2") and the literature "Template Approaches to Growth of Oriented Oxide Heterostructures on SiO2/Si", "Journal of Electric Materials, 23(1), 1923(1994)" (hereinafter called "Literature 3"), for example, disclosed is a ferroelectric capacitor formed, on a silicon substrate or on $SiO_2$ formed over a silicon substrate, of stabilized zirconia to which yttrium (Y) has been added (said zirconia will hereinafter be abbreviated as "YSZ"), a template layer composed of bismuth titanate (BTO) which has been oriented in the c axis and has a perovskite structure, a lower electrode layer composed of La—Sr—Co—O (LSCO) having a perovskite structure, a ferroelectric thin film composed of PLZT and an upper electrode layer composed of LSCO. When the template layer composed of BTO is not disposed, in other words, when LSCO/PLZT/LSCO are formed on YSZ or directly on $SiO_2$, LSCO/PLZT/LSCO have a [110] orientation and under such a situation, PLZT indicates only a low remanence. When a template layer composed of BTO is formed, on the other hand, LSCO/PLZT/LSCO shows a [001] orientation and under this situation, PLZT shows a high remanence.

The specific resistance of LSCO, which is described in Literatures 2 and 3 and is a material constituting a lower electrode is as high as 90–200 cm at room temperature and is preferred to form the lower electrode from a material having a specific resistance as low as possible, for example Pt{100}. The lattice constant of BTO is as follows: a=5.41 angstrom, b=5.43 angstrom and c=32.82 angstrom. Platinum (Pt) has a face-centered cubic lattice structure and its lattice constant is as follows: a=b=c=3.92 angstrom. The {110} lattice plane distance of BTO is substantially equal to that of Pt{100} so that if a lower electrode layer composed of Pt is formed on a template layer oriented in the c axis and composed of BTO (said template layer will hereinafter be called "buffer layer"), it becomes possible to form the lower electrode layer from Pt{100}.

Table 2 shows a lattice constant (unit: angstrom) for a and b axes and a (110) lattice plane distance (unit: angstrom) of a ferroelectric material having a perovskite-type Bi layer structure. These values are substantially identical to the lattice plane distance of Pt{100}.

TABLE 2

| Ferroelectric plane material | Lattice constant | Lattice distance |
|---|---|---|
| $Bi_2SrTa_2O_9$ | 5.512 | 3.898 |
| $Bi_2SrNb_2O_9$ | 5.500 | 3.889 |
| $Bi_2BaTa_2O_9$ | 5.556 | 3.929 |
| $Bi_4SrTi_4O_{15}$ | 5.420 | 3.833 |

In general, if the difference between the lattice plane distance of the lower electrode layer formed of Pt{100} and the lattice plane distance of the material forming the ferroelectric thin film falls within a range of 3%, the ferroelectric thin film can be epitaxially grown on the lower electrode layer. Accordingly, the ferroelectric thin film formed of a ferroelectric material having a perovskite-type Bi layer structure can be formed on the lower electrode layer formed of Pt{100}. As a result, the ferroelectric thin film formed on the lower electrode layer can be imparted with a high remanence Pr, which makes it possible to fabricate a semiconductor device having excellent performances.

The specific resistance of platinum is 15–20 cm and is lower than that of LSCO so that it is a material preferable for the semiconductor device.

In the semiconductor device described in Embodiment 4, the lower electrode layer 52 made of Pt is formed on the insulation layer 50 which corresponds to the base material. In Embodiment 5, on the other hand, the semiconductor device has the lower electrode layer 52, a capacitor structure in which a ferroelectric thin film 53 having a Bi-type layered perovskite structure and an upper electrode layer 54 have been stacked one after another, and a buffer layer 51 (corresponding to the base material) which is formed below the lower electrode layer 52 and has a Bi-type layered perovskite structure. This buffer layer 51 is formed of an oxide film which contains bismuth as a component element. FIG. 7E is a schematic fragmentary cross-sectional view of a semiconductor device fabricated based on the formation method according to Embodiment 5 for a capacitor structure of a semiconductor device.

Described specifically, in the capacitor structure of a semiconductor storage cell of Embodiment 5, the buffer layer 51 corresponding to the base material is formed on an insulation layer 50 composed of BPSG. The buffer layer 51 is formed of an oxide film made of $Bi_4SrTi_4O_{15}$ (BTO) which has been oriented in the c axis and has a Bi-type layered perovskite structure. And on the buffer layer 51, the lower electrode layer 52 composed of Pt{100} is formed. Also in Embodiment 5, the ferroelectric thin film 53 formed by the epitaxial growth on the lower electrode layer 52 is composed of $Bi_2SrTa_2O_9$. On the ferroelectric thin film 53, the upper electrode layer 54 composed of Pt{100} is formed. The structure of the semiconductor device according to Embodiment 5 is similar to that of Embodiment 4 except for the above-described points. A description will next be made of a fabrication method of a semiconductor device including that of the capacitor structure of the semiconductor device of Embodiment 5 with reference to cross-sectional views in FIGS. 7A–7E.

[Step-400]

First, in a similar manner to [Step-300] of Embodiment 5, an element isolation region 41, a gate oxide film 42, a gate electrode 43, source and drain regions 44 and a channel region 45 are formed on a silicon semiconductor substrate 40.

[Step-410]

In a similar manner to [Step-310] of Embodiment 4, the insulation layer 50 composed of an amorphous material is then formed on the semiconductor substrate 40. Described specifically, the insulation layer 50 composed of, for example, BPSG which is an amorphous material is deposited all over the substrate by, for example, the CVD method. In this manner, the structure illustrated in FIG. 7A can be obtained.

[Step-420]

On the insulation layer 50, the buffer layer 51 (corresponding to the base material) which is an oxide film containing bismuth as a component element is then formed by the CVD method, using a bismuth alkoxide compound as a raw material. Described specifically, the buffer layer 51 which is composed of bismuth titanate $Bi_4Ti_3O_{12}$ having a high orientation (in other words, the buffer layer which has been oriented in the c axis) is formed in accordance with the oxide film formation method which will be described hereinafter (refer to FIG. 7B). The buffer layer is adjusted to have a thickness of from 0.01 μm to 0.02 μm.

As shown in FIG. 2, upon the formation of the buffer layer 51, tributoxy bismuth is filled in a raw material container 10 and heated to 80–110° C. Into the raw material container 10, an argon gas is introduced at a flow rate of 50–100 cc, whereby tributoxy bismuth is sublimated under heating at reduced pressure. Via a piping 14 maintained at about 110° C., tributoxy bismuth thus vaporized is sent to an MOCVD reaction chamber 20.

On the other hand, tetraisopropoxytitanium is filled in a raw material container 12 and heated to about 40° C. An argon gas is introduced into the raw material container 12 at a flow rate of 50 cc, whereby bubbling of tetraisopropoxytitanium which has been in the form of a liquid under heating at reduced pressure is conducted. The tetraisopropoxytitanium so vaporized is introduced into a piping 15 which has been maintained at about 80° C. and then sent to the MOCVD reaction chamber 20 via the piping 14.

A base material 30 disposed on a base material stage in the MOCVD reaction chamber 20 is heated to 400–800° C. and tributoxybismuth in the form of a gas, a tetraisopropoxytitanium gas, an oxygen gas and an argon gas for dilution are introduced into the MOCVD reaction chamber 20, whereby an oxide film composed of bismuth titanate ($Bi_4Ti_3O_{12}$) is formed on the base material 30.

In other words, the buffer layer 51 (corresponding to the base material) composed of bismuth titanate ($Bi_4Ti_3O_{12}$) and having a high orientation can be formed on the insulation layer 50.

Incidentally, the buffer layer 51 can be formed of $Bi_2SrTa_2O_9$ which has been formed into a film in a similar manner to Embodiment 2.

[Step-430]

The lower electrode layer 52 is thereafter formed on the buffer layer 51. Described specifically, the lower electrode layer 52 which is composed of Pt and having a high orientation is deposited on the buffer layer 51 by the RF magnetron sputtering method. The lower electrode layer 52 is adjusted to have a thickness of 0.1 μm to 0.2 μm. The RF magnetron sputtering can be conducted under the similar conditions to [Step-320] of Embodiment 4. Incidentally, the lower electrode layer 52 composed of Pt has a {100} plane. In other words, the {100} plane of platinum Pt which constitutes the lower electrode layer 52 is formed in parallel with the surface of the buffer layer 51.

The lower electrode layer 52 is then patterned to a desired shape by using, for example, the ion milling technique.

Figure 7A:
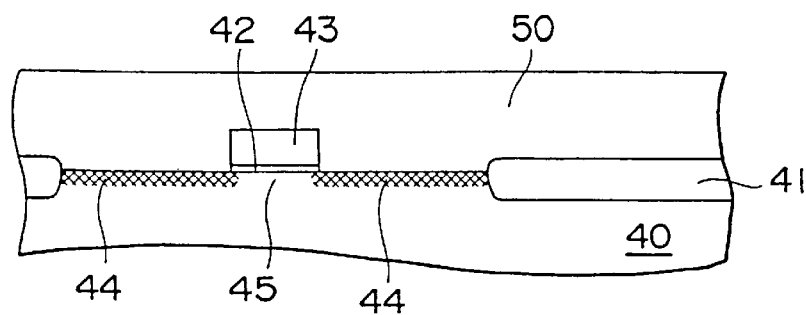
FIGS. 7 ($a$) to 7($e$) show fabrication of a semiconductor device according to another embodiment of the invention.
Figure 7B:
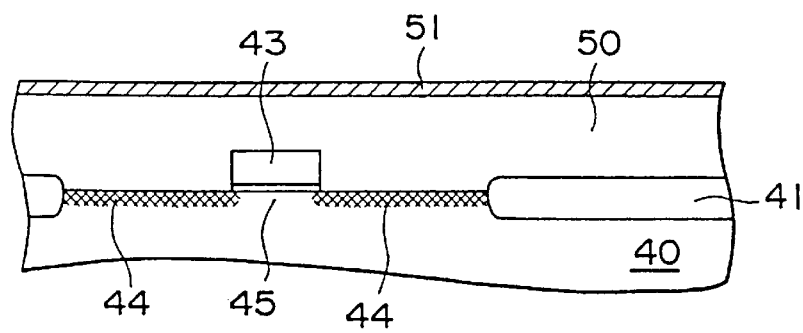
Figure 7C:
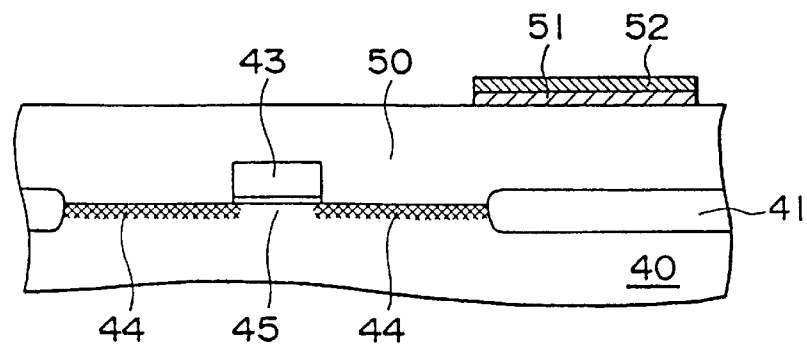

Furthermore, the buffer layer 51 which is an oxide film composed of BTO is patterned to a desired shape by, for example, the RIE method (Refer to FIG. 7C).

Incidentally, it is possible to form the lower electrode layer composed of Pt{100} by the pulse laser deposition method. The following are the film forming conditions of Pt{100} in accordance with the pulse laser deposition method:

Film forming conditions in accordance with the pulse laser deposition method:

Target: Pt

Laser used: Krf excimer Laser (wavelength: 248 nm, pulse width: 25 n/sec, 5Hz, 1.1 J/cm$^2$)

Film forming temperature: 500–600° C.

[Step-440]

On the lower electrode layer 50, the ferroelectric thin film 53 made of Bi2SrTa2O9 is grown epitaxially in a similar manner to Embodiment 2.

Incidentally, the epitaxially grown ferroelectric thin film 53 composed of $Bi_2SrTa_2O_9$ has an orientation of [110] relative to the surface of the lower electrode layer 52.

Alternatively, similar to [Step-420], a ferroelectric thin film composed of $Bi_4Ti_3O_{12}$ (BTO) having a Bi-type layered perovskite structure can be formed on the lower electrode layer 52 by the MOCVD method using tributoxy bismuth as a raw material gas.

Furthermore, a ferroelectric thin film composed of PZT can be grown epitaxially on the lower electrode layer 52 by the magnetron sputtering method. Film forming conditions will be described subsequently. The ferroelectric thin film composed of PZT has a (100) plane. In other words, the epitaxially grown ferroelectric film composed of PZT has an orientation of [100] relative to the surface of the lower electrode layer 52. Incidentally, by changing the target to PLZT, a ferroelectric thin film composed of PLZT can be epitaxially grown on the lower electrode layer 52.

| Target | PZT |
|---|---|
| Processing gas | Ar:O$^2$ = 90 vol. %:10 vol. % |
| Pressure | 4 Pa |
| Power | 50 W |
| Film forming temperature | 500° C. |

A ferroelectric thin film made of PZT or PLZT can also be formed by the pulse laser ablation method. Film forming conditions in this case are as follows:

| Target | PZT or PLZT |
|---|---|
| Laser used | KrF excimer laser |
| (wavelength: 248 nm, pulse width 25 n/sec, 3 Hz) | |
| Output energy | 400 mJ (1.1 J/cm$^2$) |
| Film forming temperature | 550–600° C. |
| Oxygen partial pressure | 40–120 Pa |

It is also possible to form a ferroelectric thin film from $Bi_2SrTa_2O_9$ by the pulse laser ablation method. Film forming conditions for the ferroelectric thin film composed of $Bi_2SrTa_2O_9$ will be shown below. Incidentally, it is desired to conduct post-baking in an oxygen atmosphere at 800° C. for one hour subsequent to the formation of the $Bi_2SrTa_2O_9$ film.

| Target | Bi$_2$SrTa$_2$O$_9$ |
|---|---|
| Laser used | KrF excimer laser |
| (wavelength: 248 nm, pulse width 25 n/sec, 5 Hz) | |
| Film forming temperature | 500° C. |
| Oxygen partial pressure | 3 Pa |

[Step-450]

On the ferroelectric thin film 53, an upper electrode layer 54 is then formed. The upper electrode layer 54 is composed of Pt{100} and can be formed in a similar manner to [Step-320] of Embodiment 4.

[Step-460]

Figure 7D:
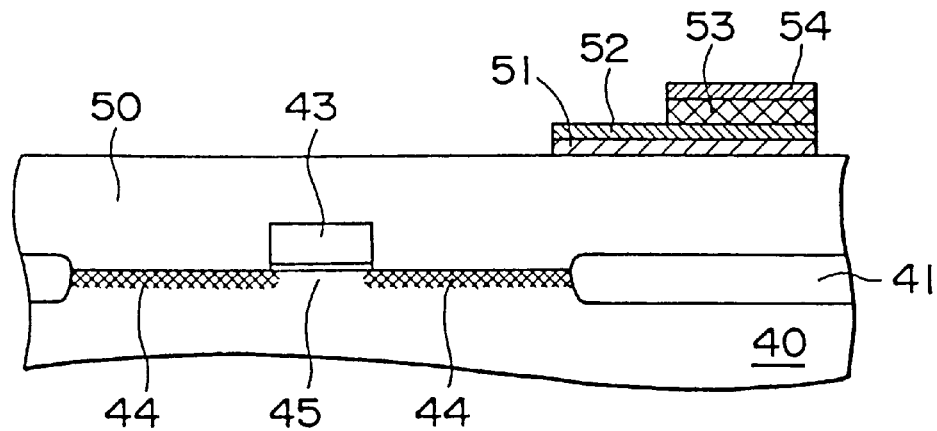
Figure 7E:
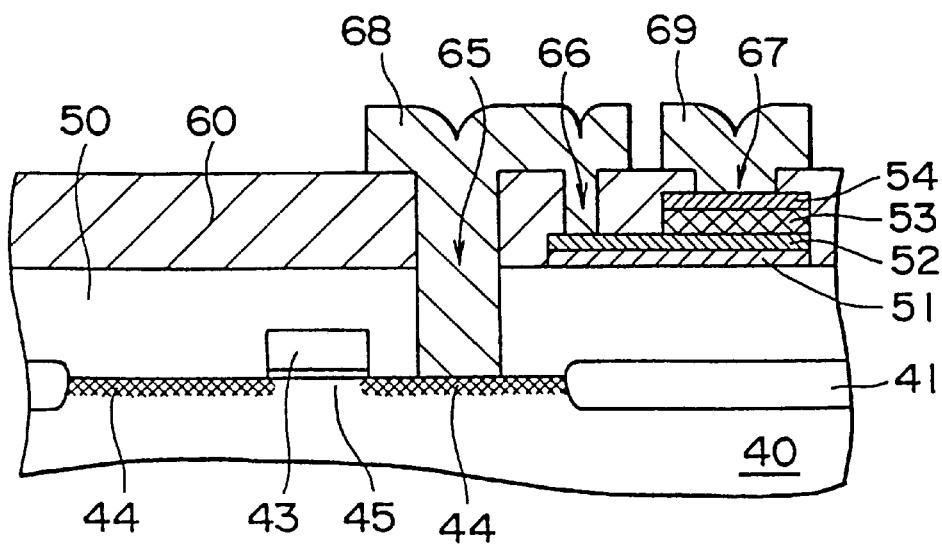

The upper electrode layer 54 composed of Pt is then patterned into a desired shape by using, for example, the ion milling technique, followed by further patterning of the ferroelectric thin film 53 by the RIE method. In this way, the capacitor structure of the semiconductor device having a structure as shown in FIG. 7D can be obtained.

[Step-470]

The semiconductor memory cell having a structure as shown in FIG. 7E can then be fabricated through the steps similar to [Step-360] and [Step-370] of Embodiment 5.

Incidentally, it is possible to form, for example, stabilized zirconia (YSZ), which has been obtained by adding yttrium oxide $Y_2O_3$ to zirconium oxide $ZrO_2$, between the buffer layer 51 and the insulation layer 50. Such a ground layer can be formed, for example, by the MOCVD or pulse laser deposition method. The film forming conditions for these methods are as follows:

Film forming conditions for the MOCVD method

| Source material | Zr(C$_4$H$_9$)$_4$ |
|---|---|
| | Y(C$_{11}$H$_{19}$O$_2$)$_3$ |
| Film forming temperature | 550–650° C. |
| Film forming pressure | 27–400 Pa |
| Oxygen concentration | 50% |
| Film forming conditions for the pulse laser method | |
| Target | ZrO$_2$/Y |
| Laser used | KrF excimer laser |
| (wavelength: 248 nm, pulse width 25 n/sec, 5 Hz, 1.1 J/cm$^2$) | |
| Film forming temperature | 500° C. |
| Oxygen partial pressure | 3 Pa |

(Embodiment 5)

Embodiment 5 relates to a method for the formation of an oxide film, which comprises using a bismuth alkoxide compound as a raw material and forming, by the CVD method, a superconductive thin film made of an oxide film containing bismuth as a component element. The oxide film is a Bi—Sr—Ca—Cu—O base film.

In Embodiment 5, the MOCVD apparatus as described in Embodiment 1 is employed and as a base material, Si(100) is used. The raw material gas used in the MOCVD method is as follows:

Bi source: tributoxybismuth [Bi(OC(CH$_3$)$_3$)$_3$]

Sr source: Sr(C$_{11}$H$_{19}$O$_2$)$_2$ [Sr(tmhd)$_2$]

Ca source: Ca(C$_{11}$H$_{19}$O$_2$)$_2$ [Ca(tmhd)$_2$]

Cu source: Cu(C$_5$H$_7$O$_2$)$_2$ [Cu(acac)$_2$]

The above raw materials are heated to an appropriate temperature in a raw material container. On a base material 30 made of Si(100), said base material being disposed on a material stage 22 in the MOCVD reaction chamber 21 and heated to an appropriate temperature, an Ar carrier gas, an oxygen gas and the above-described raw material gases are introduced, whereby an ultraconductive thin film composed of a Bi—Sr—Ca—Cu—O base oxide film can be formed on the base material 30.

The present invention has been described in accordance with the above preferred embodiments. It should however be borne in mind that this invention is not limited to or by these embodiments.

When Sr($C_{11}H_{19}O_2$)$_2$ [distetramethylheptanedione) strontium], Ba($C_{11}H_{19}O_2$)$_2$ [dis(tetramethylheptanedione) barium and Ca($C_{11}H_{19}O_2$)$_2$ [dis(tetramethylheptanedione) calcium] are used as source materials for Sr, Ba and Ca and Ta(OC$_2$H$_5$)$_5$ [pentaethoxytantalum] and Nb(OC$_2$H$_5$)$_5$ [pentaethoxyniobium] are used as source materials for Ta and Nb, an oxide film made of a Y1 base material composed of Bi$_2$AB$_2$O$_8$ in which A represents an element selected from the group consisting of Sr, Ba and Ca and B represents an element selected from the group consisting of Ta and Nb can be formed on the base material by the MOCVD method. Incidentally, as a combination example of the elements A and B, not only Sr/Ta, but also Sr/Nb, Ba/Ta, Ba/Nb, Ca/Ta and Ca/Nb can be given.

Figure 8A:
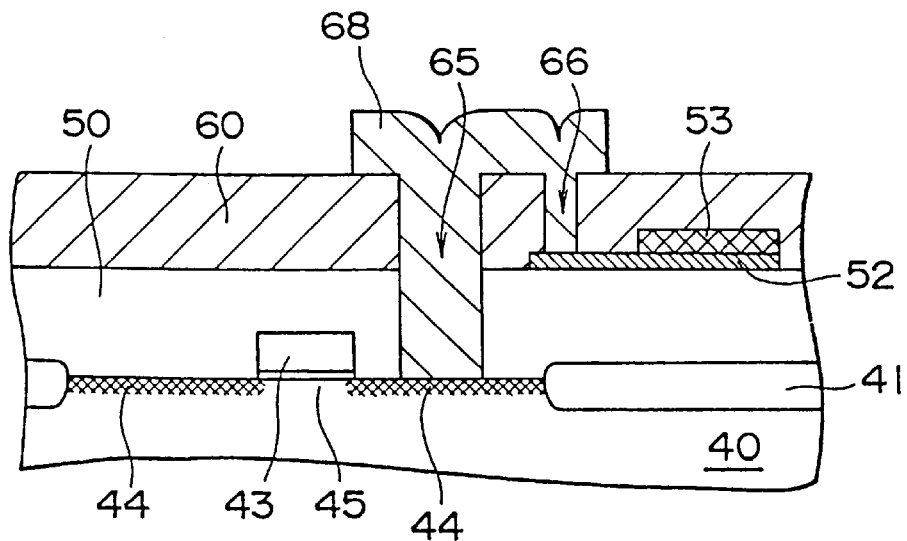
FIGS. 8($a$) and 8($b$) show another semiconductor device design made according to the invention FIGS. 9($a$) to 9($c$) show another semiconductor device design made according to the invention.
Figure 8B:
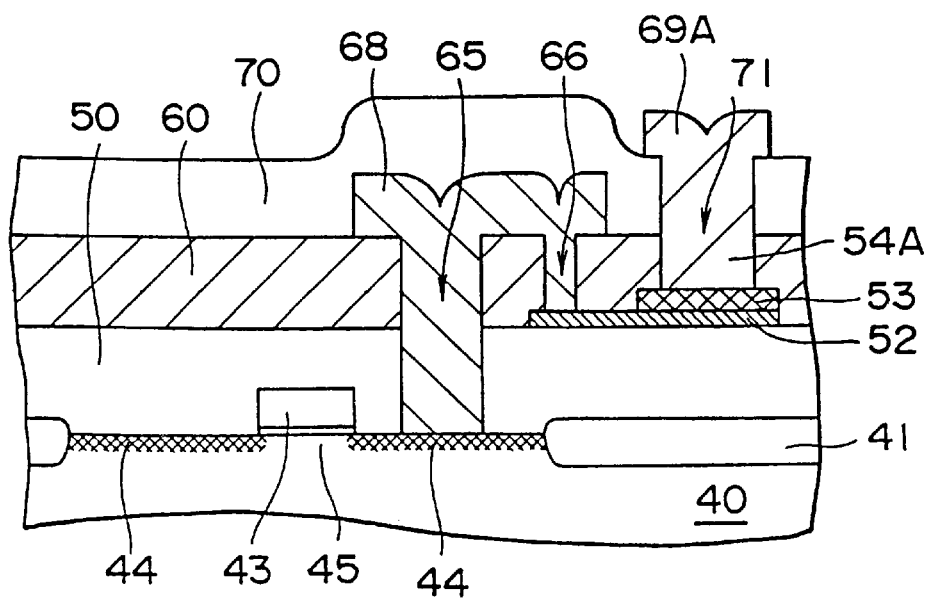

The structure of the semiconductor device which is described in the fabrication method of the capacitor structure of the semiconductor device according to the present invention is only an example and its design can be changed as needed. For example, it is possible to fabricate the semiconductor device in which the upper electrode layer serves also as a plate line. In the capacitor structure of the semiconductor device having such a structure, a ferroelectric thin film 53 is formed as described in [Step-330] of Embodiment 5 and then, the ferroelectric thin film 53 is patterned into a desired shape. After an upper insulation layer 60 is formed all over the surface, an opening 61 is formed in the insulation layer 50 and the upper insulation layer 60, while an opening 62 is formed in the upper insulation layer 60 on the lower electrode layer 52. On the upper insulation layer 60 including therein the openings 61, 62, a Ti layer, a TiN layer and an interconnection material layer made of an aluminum base alloy are successively formed. The interconnection material layer, TiN layer and Ti layer on the upper insulation layer 60 are then patterned, whereby a first interconnection layer 68 composed of an interconnection material layer made of an aluminum alloy is formed (Refer to FIG. 8A). All over the surface, a second insulation layer 70 made of, for example, BPSG is then formed. In the upper insulation layer 60 and the second insulation layer 70 above the ferroelectric thin film 53, an opening 71 is formed, followed by the formation of a Pt film on the second insulation layer 70, which includes therein the opening 71, in a similar manner to [Step-340] of Embodiment 5. The Pt film on the second insulation layer 70 is then patterned with the Pt film being left in the opening 71, whereby an upper electrode layer 54 composed of Pt is formed on the ferroelectric thin film 53. This upper electrode layer 54A extends above the second insulation layer 70 via the opening 71 and forms a second interconnection layer 69A, which serves also as a plate line (Refer to FIG. 8B). Incidentally, the upper electrode layer 54A and the second interconnection layer 69A can alternatively be formed of an aluminum base alloy.

Instead of having a LOCOS structure, the element isolation region 41 may have a trench structure. Instead of forming of a polysilicon layer, the gate electrode 43 and the bit line can also be formed of a polycide or metal silicide. Examples of the insulation layer include, in addition to BPSG, conventionally-known insulation materials such as SiO$_2$, PSG, BSG, AsSG, PbSG, SbSG, SOG, SiON, SiN, NSG and LTO and also an insulation material in which these exemplified materials have been stacked one after another. Flattening of the insulation layer may be conducted by, for example, the resist etchback method. The ferroelectric thin film may have a structure in which plural ferroelectric materials have been stacked one after another.

In [Step-370] of Embodiment 4 and [Step-470] of Embodiment 5, an aluminum alloy is filled in the opening 61 formed in the insulation layer 50 and the upper insulation layer 60, thereby forming a contact plug 65. Alternatively, a contract plug 65A can be formed by the so-called blanket tungsten CVD method.

For this method, the opening 61 is formed in the insulation layer 50 and the upper insulation layer 60, followed by the formation of a Ti layer and a TiN layer by the sputtering method in a similar to [Step-370] of Embodiment 4. Then, an interconnection material layer 64A made of tungsten is deposited on the TiN layer by the CVD method under the following conditions (Refer to 9A).

Gas used: WF$_6$/H$_2$/Ar=40/400/2250 sccm
Pressure: 10.7 kPa
Film forming temperature: 450° C.

Figure 9A:
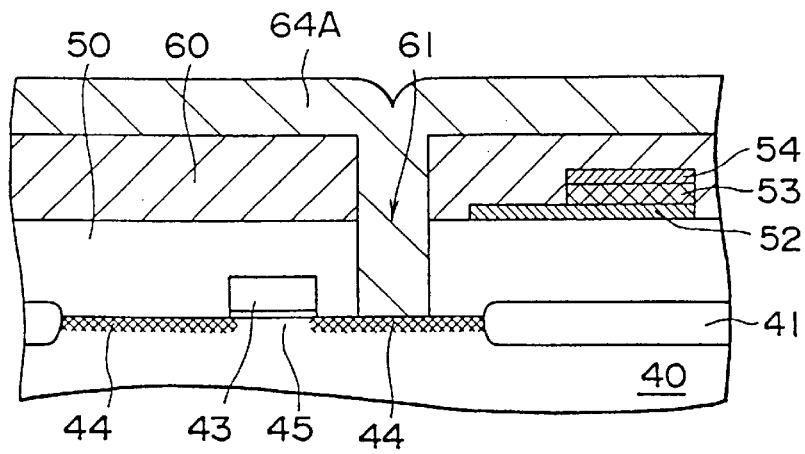
Figure 9B:
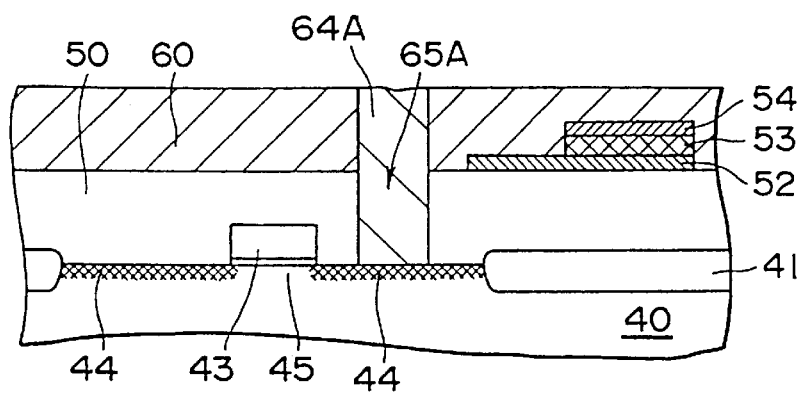
Figure 9C:
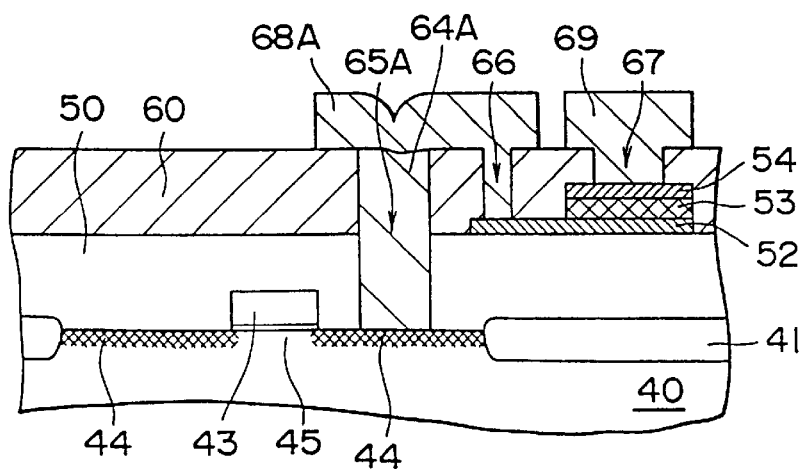

The interconnection material layer 64A made of tungsten, the TiN layer and Ti layer above the insulation layer 50 are then removed by etching (refer to FIG. 9B). Etching can be conducted, for example, under the following conditions:
Etching in the first stage: etching of the tungsten layer
Gas used: SF$_6$/Ar/He=110/90/5 sccm
Pressure: 46 Pa
RF power: 275 W
Etching in the second stage: etching of the Tin layer/ Ti layer
Gas used: Ar/Cl$_2$=75/5 sccm
Pressure: 6.5 Pa
RF power: 250 W In this way, a contact plug 65A having the opening 61 buried with tungsten can be formed. An opening is then formed in the upper insulation layer 60 above the lower electrode layer 52 and the upper electrode layer 54, followed by the formation of a Ti layer, TiN layer and interconnection material layer made of an aluminum base alloy by the sputtering method in a similar manner to [Step-370] of Embodiment 4. Each of these layers is patterned, whereby a first interconnection layer 68 and a second interconnection layer 69 are formed (refer to FIG. 9C). Incidentally, the contact plug 65A may be formed by filling polysilicon, which contains doped impurities, in the opening 61.

Or, an opening 61 is formed in the insulation layer 50 and the upper insulation layer 60, followed by the formation of an opening 62 in the upper insulation layer 60 on the lower electrode layer 52. On the upper insulation layer 60 including the openings 61 and 62 therein, a Ti layer, TiN layer and interconnection material layer 64A made of tungsten are formed successively. The interconnection material layer 64A, TiN layer and Ti layer above the upper insulation layer 60 are patterned to form a first interconnection layer 68A formed of the interconnection material layer 64A and the like. At the same time, contact plugs 65A,66A may be formed. Then, an opening 63 is formed in the upper insulation layer 60 above the upper electrode layer 54, followed by the formation of an interconnection material layer composed of a Ti layer, TiN layer and an interconnection material layer made of an aluminum alloy by the sputtering method in a similar manner to [Step-360] of Embodiment 5. These layers are patterned to form a second interconnection layer 69. In this way, a structure shown in FIG. 9D can be formed.

It is also possible to form a contact plug 65A in the insulation layer 50, for example, by the blanket tungsten CVD method and then to form a lower electrode layer 52 connected with the contact plug 65A on the insulation layer 50 in a similar manner to [Step-320] of Embodiment 5. [Step-330], [Step-340] and [Step-350] of Embodiment 5 are thereafter effected. On the insulation layer 50 and the upper electrode layer 54, an upper insulation layer 60 composed of BPSG is formed. After an opening is formed in the upper insulation layer 60 on the upper electrode layer 54, a contact plug 67 is formed in the opening in a similar manner to [Step-370] of Embodiment 5, followed by the formation of an interconnection layer 69B on the upper insulation layer 60. In this way, a semiconductor device having the structure as shown in FIG. 10 is available. Examples of the aluminum base alloy usable in the present invention include various aluminum alloys composed of pure aluminum, Al—Si, Al—Cu, Al—Si—Cu, Al—Ge and Al—Si—Ge. Instead of the aluminum base alloy, the first interconnection layer and the second interconnection layer can be formed using polysilicon, titanium, titanium alloy, copper, copper alloy, tungsten or tungsten alloy. In the above-described Embodiments, the ground for the contact plug is formed of two layers, that is, Ti and TiN but it is also possible to form the ground from a single layer of Ti or TiN. The contact plug can also be formed of TiW, TiNW, $WSi_2$, $MoSi_2$ or the like.

In the above Embodiment, the ferroelectric thin film is electrically connected with one of the source and drain regions via the contact plug and the first interconnection layer, but it is also possible to dispose an interconnection electrically connected with a contact plug electrically connected with one of the source and drain regions, forming another connection hole (for example, beer hole) electrically connected with the above interconnection, whereby the ferroelectric thin film can be electrically connected with this connection hole. Alternatively, a capacitor structure of a semiconductor device can be formed by forming the lower electrode layer and buffer layer above the element isolation region. In this case, the element isolation region or the buffer layer corresponds to the base material.

The bit line can be formed, for example, by the method described below. Described specifically, a lower insulation layer is formed between (Step-300] and [Step-310] of Embodiment 4. On the lower insulation layer above the other one of the source and drain regions 44, an opening is formed by the photolithography technique and the etching technique. The polysilicon layer is then deposited by, for example, the CVD method on the lower insulation layer including therein the opening, whereby a bit contact portion which has an opening buried with polysilicon can be formed. The polysilicon layer on the lower insulation layer is then patterned. In this way, the bit line made of polysilicon which is electrically connected with the other one of the source and drain regions through the bit contact portion is formed. On the lower insulation layer including the bit line, the insulation layer 50 is formed. Incidentally, the bit line is formed in any order so that it is also possible to form the bit line after formation of the second interconnection layer.

Not only an non volatile memory cell (so-called FERAM) using a ferroelectric thin film, but also DRAM can be formed as a semiconductor device. In this case, only polarization of the ferroelectric thin film is used. Described specifically, what is made use of is a characteristic in which difference ($P_{max}-P_r$) between the maximum (saturated) polarization $P_{max}$ by the external electrode and the remanence $P_r$ in the case where the external electrode is 0 is in proportionate to the source voltage. The polarization state of the ferroelectric thin film always exists between the saturated polarization ($P_{max}$) and remanence ($P_r$) and no inversion occurs. Data is maintained by the refresh.

What is claimed is:

1. A process for the preparation of bismuth oxide, which comprises preparing bismuth oxide by the CVD method using a bismuth alkoxide compound as a raw material.

2. A method for the formation of an oxide film, which comprises using a bismuth alkoxide compound as a raw material and forming, by the CVD method, an oxide film containing bismuth as a component element.

3. A method according to claim 2, wherein said oxide film comprises a ferroelectric material having a bismuth-type layered perovskite structure.

4. A method according to claim 3, wherein said oxide film comprises an Y1 type material [$Bi_2(Sr,Ba,Ca) (Ta,Nb)_2O_9$].

5. A method according to claim 4, wherein said Y1 type material comprises $Bi_2SrTa_2O_9$.

6. A method for the fabrication of a capacitor of a semiconductor memory cell, which comprises:

forming a lower electrode layer on a substrate, forming, by the CVD method, a ferroelectric thin film containing bismuth as a component element, using a bismuth alkoxide compound as a raw material, and forming an upper electrode layer on the ferroelectric thin film.

7. A method according to claim 6, wherein said ferroelectric thin film comprises a ferroelectric material having a bismuth-type layered perovskite structure.

8. A method according to claim 7, wherein said ferroelectric thin film comprises an Y1 type material [$Bi_2(Sr,Ba,Ca)(Ta,Nb)_2O_9$].

9. A method according to claim 8, wherein said Y1 type material comprises $Bi_2SrTa_2O_9$.

* * * * *